United States Patent
Crowder et al.

(10) Patent No.: US 6,777,276 B2
(45) Date of Patent: Aug. 17, 2004

(54) SYSTEM AND METHOD FOR OPTIMIZED LASER ANNEALING SMOOTHING MASK

(75) Inventors: Mark Albert Crowder, Portland, OR (US); Yasuhiro Mitani, Osaka (JP); Apostolos T. Voutsas, Vancouver, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 1 day.

(21) Appl. No.: 10/232,089

(22) Filed: Aug. 29, 2002

(65) Prior Publication Data

US 2004/0043606 A1 Mar. 4, 2004

(51) Int. Cl.[7] .............................................. H01L 21/00
(52) U.S. Cl. ........................................ 438/166; 355/53
(58) Field of Search .............................. 438/149–151, 438/97, 166; 257/59, 72; 355/53, 67

(56) References Cited

U.S. PATENT DOCUMENTS 5,142,120 A * 8/1992 Hanson et al. ......... 219/121.83
6,680,460 B1 * 1/2004 Takaoka et al. ....... 219/121.73

OTHER PUBLICATIONS

M. Crowder. PhD Dissertation, pp. 64–65.

* cited by examiner

Primary Examiner—David Nelms
Assistant Examiner—David Vu
(74) Attorney, Agent, or Firm—David C. Ripma; Matthew D. Rabdau

(57) ABSTRACT

A laser annealing mask is provided with cross-hatched sub-resolution aperture patterns. The mask comprises a first section with aperture patterns for transmitting approximately 100% of incident light, and at least one section with cross-hatched sub-resolution aperture patterns for diffracting incident light. In one aspect, a second mask section with cross-hatched sub-resolution aperture patterns has an area adjacent a vertical edge and a third mask section with cross-hatched sub-resolution aperture patterns adjacent the opposite vertical edge, with the first mask section being located between the second and third mask sections. The section with cross-hatched sub-resolution aperture patterns transmits approximately 40% to 70%, and preferably 50% to 60% of incident light energy density. In some aspects, the section with cross-hatched sub-resolution aperture patterns includes a plurality of different cross-hatched aperture patterns. The cross-hatched sub-resolution aperture patterns can be defined by horizontal gap and slits, as well as vertical gap and slits.

35 Claims, 9 Drawing Sheets

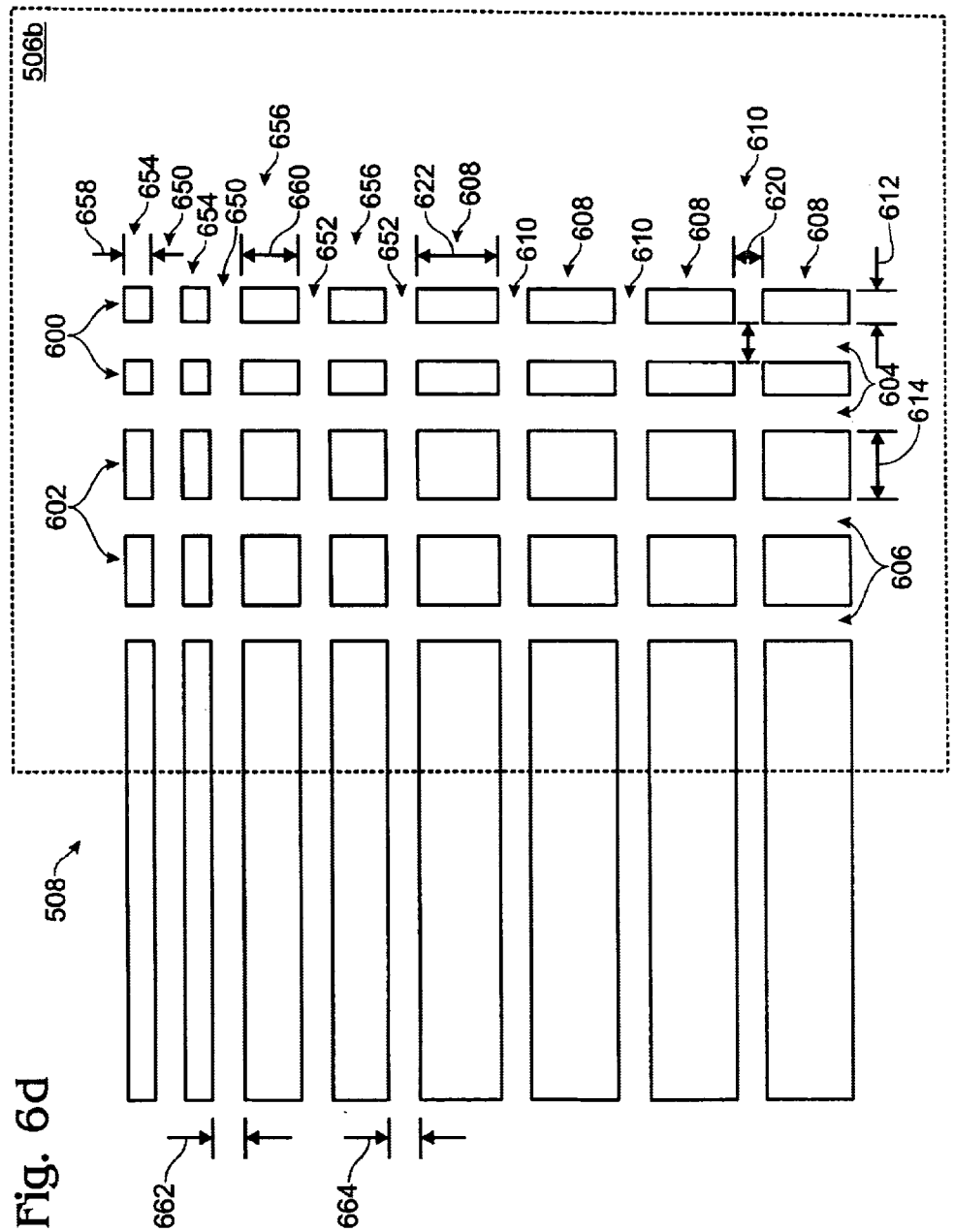

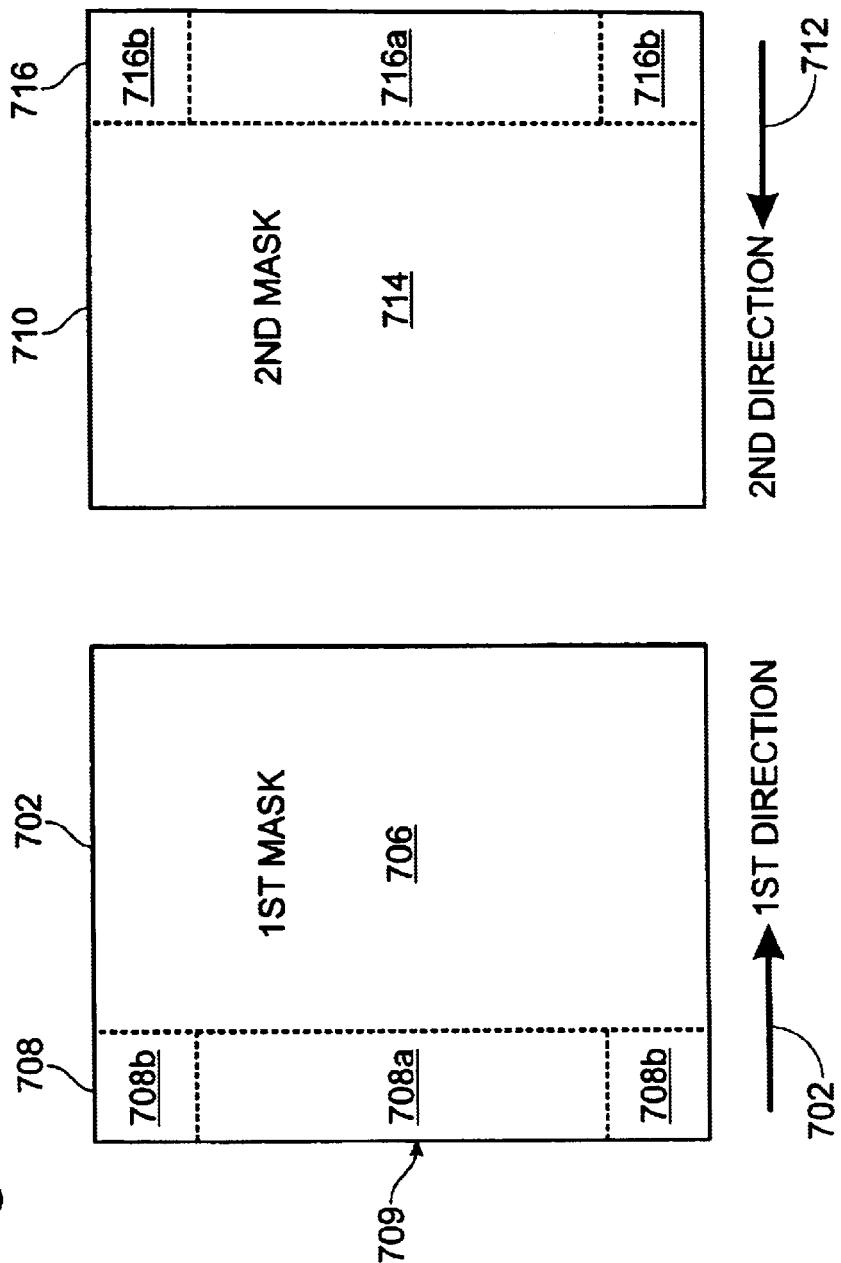

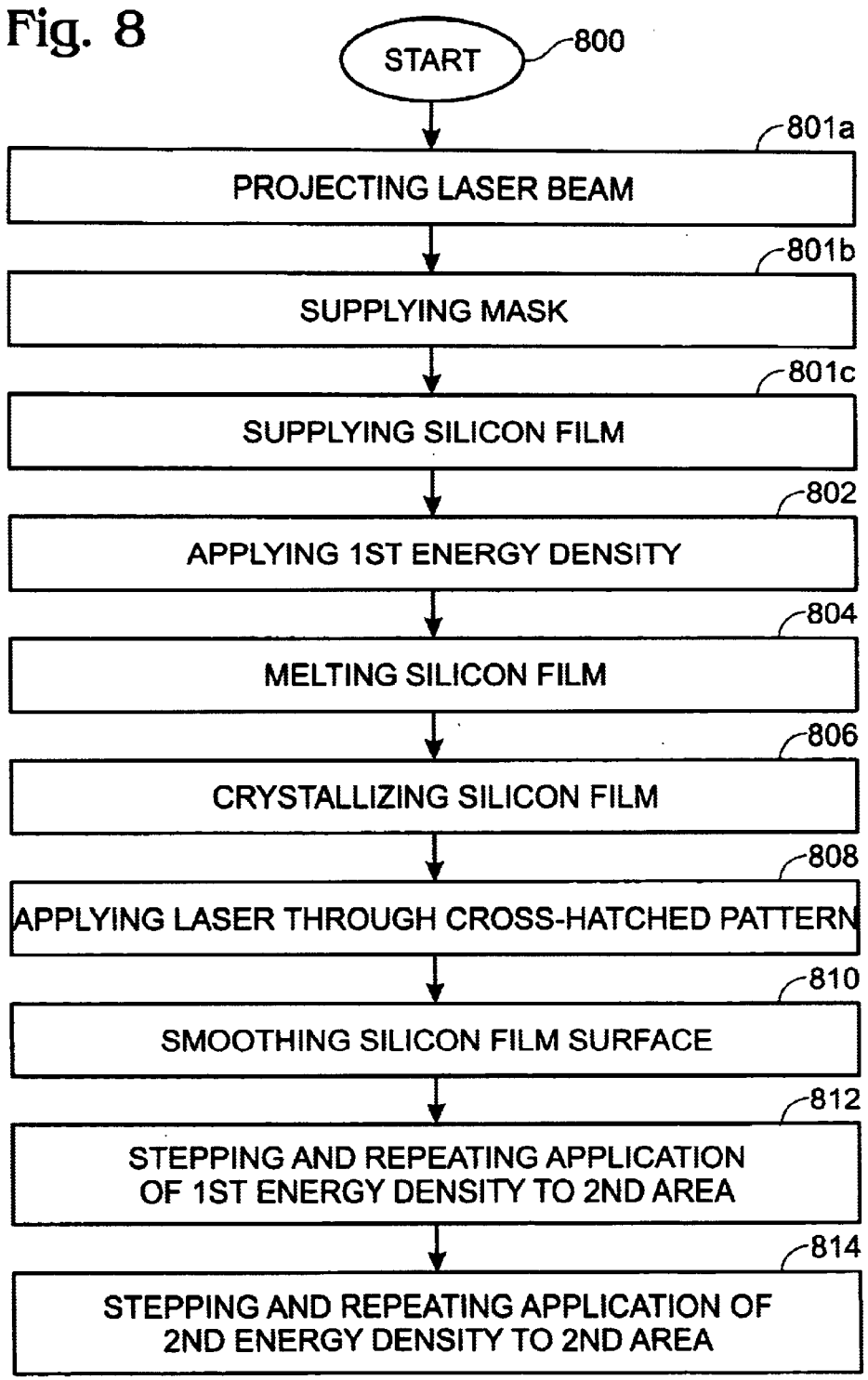

SYSTEM AND METHOD FOR OPTIMIZED LASER ANNEALING SMOOTHING MASK

RELATED APPLICATIONS

This application is a continuation-in-part of a pending patent application entitled, LASER ANNEALING MASK AND METHOD FOR SMOOTHING AN ANNEALED SURFACE, invented by Mitani et al., Ser. No. 10/124,826, filed Apr. 17, 2002.

BACKGROUND OF THE INVENTION

1. Field of the Invention

This invention generally relates to integrated circuit (IC) thin film processing techniques and, more particularly, to post-crystallization annealing techniques that can be applied to semiconductor or metal films at low temperatures.

2. Description of the Related Art

When forming thin film transistors (TFTs) for use in liquid crystal display (LCD) or other microelectronic circuits, the location of transistors channel regions, the orientation of regular structured polycrystalline silicon (poly-Si) or single-grain-crystalline silicon, and the surface roughness are important issues. This poly-Si material can be used as the active layer of poly-Si TFTs in the fabrication of active-matrix (AM) backplanes. Such backplanes can be used in the fabrication of AM LCDs and can be also combined with other display technologies, such as organic light-emitting diode (OLED) displays.

Poly-Si material is typically formed by the crystallization of initially deposited amorphous Si (a-Si) films. This process can be accomplished via solid-phase-crystallization (SPC), for example, by annealing the a-Si films in a furnace at appropriate temperature and for sufficiently long time. Alternatively, laser annealing can also be used to achieve the phase transformation.

Conventionally, crystallization techniques are applied to a substrate in such a manner as to yield uniform poly-Si film quality throughout the substrate area. In other words, there is no spatial quality differentiation over the area of the substrate. The most important reason for this end result is the inability of conventional methods to achieve such quality differentiation. For example, when a-Si film is annealed in a furnace or by rapid-thermal-annealing, all of the film is exposed to the same temperature, resulting in the same quality of poly-Si material. In the case of conventional laser annealing, some differentiation is possible, but the price, in terms of loss of throughput, is very high for the modest performance gains realized.

Recently, a new laser annealing technique has been developed that allows for significant flexibility in the process techniques, permitting controlled variation in resulting film microstructure. This technique relies on lateral growth of Si grains using very narrow laser beams, that are generated by passing a laser beam through a beam-shaping mask, and projecting the image of the mask to the film that is being annealed. The method is called Laser-Induced Lateral Crystallization (LILaC).

FIG. 1 is a diagram illustrating the LILaC process (prior art). The initially amorphous silicon film is irradiated by a very narrow laser beamlet, with typical widths of a few microns (i.e. 3–5 $\mu$m). Such small beamlets are formed by passing the original laser beam through a mask that has open spaces or apertures (see FIG. 2), and projecting the beamlets onto the surface of the annealed Si-film.

FIG. 2 is a conventional laser annealing mask (prior art). Returning to FIG. 1, the sequence of images 1 through 4 illustrates the growth of long silicon grains. A step-and-repeat approach is used. The shaped laser "beamlet" (indicated by the 2 parallel, heavy black lines) irradiates the film and then steps by a distance smaller than half of the width of the slit. As a result of this deliberate advancement of each beamlet, grains are allowed to grow laterally from the crystal seeds of the poly-Si material formed in the previous step. This is equivalent to laterally "pulling" the crystals, as in zone-melting-crystallization (ZMR) method or other similar processes. As a result, the crystal tends to attain very high quality along the "pulling" direction, in the direction of the advancing beamlets. This process occurs simultaneously at each slit on the mask, allowing for rapid crystallization of the area covered by the projection of the mask on the substrate. Once this area is crystallized, the substrate moves to a new (unannealed) location and the process is repeated.

FIG. 3 is a pictorial representation of a system to accomplish the optical projection and the step-and repeat process (prior art). The LILaC process has the potential for creating intentional spatial variations in the quality of the poly-Si material. Such intentional variations can be beneficial for applications where multiple components are integrated on a display, where each component has different specifications and material performance requirements.

Some poly-Si materials formed through the LILaC process have a highly periodical microstructure, where crystal bands of specific width are separated by high-angle grain boundaries. Within the crystal bands, low-angle boundaries are observed with a frequency of occurrence dependent upon certain specifics of the crystallization process, such as film thickness, laser fluence (energy density), pulse duration, and the like. TFTs fabricated on such poly-Si films demonstrate very good characteristics, as long as the direction of conduction is parallel to the direction of the in-crystal low-angle boundaries.

TFTs with greater electron mobility can be fabricated if the substrate crystallization characteristics can be made more isotropic. In other words, the TFT performance depends upon the angle between the main crystalline growth direction, the direction parallel to the laser scanning axis, and the TFT channel. This is due to the formation of sub-boundaries within the crystal domains. The surface roughness at the "hard" grain boundaries, at the edges of the crystal bands/domains, can be significant. This surface roughness prohibits the reduction of the gate insulator thickness, which is one critical step for scaling down the device geometry for future applications. Further, not all these processes can be location controlled. Therefore, by chance only, depending upon the relative size of the crystal domain and the TFT channel length, certain TFTs will not include grain-boundaries in their active area (channel), whereas other TFTs will include one or more boundaries in their active areas. This kind of non-uniformity is highly detrimental for critical-application TFTs where uniformity of characteristics is more essential than absolute performance.

One embodiment of the SLS/LILaC process involves the use of a large array of narrow slits that simultaneously melt and solidify the Si thin film in such a way as to fully crystallize the entire film after two passes that are stitched together. The drawback to such an approach is that due to volume expansion of the Si material during solidification, a large peak appears in the center of each irradiated region with a magnitude approximately equal to that of the film thickness. This peak-to-valley roughness can be detrimental to the characteristics of devices subsequently fabricated on the thin film. One way to eliminate or reduce the magnitude of this surface roughness, which has been described in pending application LASER ANNEALING MASK AND METHOD FOR SMOOTHING AN ANNEALED SURFACE, incorporated herein by reference, is to partially melt the Si thin film and cause the mass to redistribute itself to reduce the surface tension of the liquid material. This pending application describes a mask that uses diffractive optics to create a homogenous beam with a reduced transmission in the energy density at the sample plane. This homogenous beam then "flood" irradiates the sample and induces partial melting of the film.

FIG. 4 is a plan view of a mask for partially melting a thin film (prior art). The figure shows the upper right-hand corner of a mask pattern that can be used for creating the homogenous beam that is projected onto the Si film. The white lines running left-to-right are open slits that allow the laser beam to pass through the mask (i.e., 100% transmission), whereas the dark gaps between the slits block the beam off (i.e., 0% transmission). By manipulating the widths of these lines, the overall percentage of light that is made incident on the sample can be precisely controlled due to diffractive effects in the projection system.

Such a method is also applicable to in-situ reduction of surface roughness during other methods of SLS/LILaC processing, such as directional solidification, as the mask design can be easily incorporated into the reticle being used for the SLS/LILaC processing.

The use of a specific width of lines and gaps allows for an optimal transmission of energy to the thin film being processed. For the case of films with a thickness on the order of 500 to 1,000 Å thick, this optimal transmission is roughly 55% in many circumstances. However, unwanted diffractive effects at the edges of the pattern can lead to complete melting of the Si thin film.

It would be advantageous if the above-described post annealing surface smoothing process could be further refined to increase throughput and to reduce processing times.

It would be advantageous if the unintentional diffraction effects associated with post-annealing smoothing mask patterns could be reduced or eliminated.

SUMMARY OF THE INVENTION

The present invention introduces a single-mask that includes sections of 100% light transmission, to melt a semiconductor film, and cross-hatched sub-resolution aperture sections around at least some of the mask edges. In this manner, one mask can be used for both annealing and smoothing. The aperture patterns reduce mask edge diffraction patterns that unintentionally melt the silicon film during the smoothing process.

Accordingly, a laser annealing mask is provided with cross-hatched sub-resolution aperture patterns. The mask comprises a first section with aperture patterns for transmitting approximately 100% of incident light, and at least one section with cross-hatched sub-resolution aperture patterns for diffracting incident light. In one aspect, a second mask section with cross-hatched sub-resolution aperture patterns has an area adjacent a leading mask edge, with respect to a first direction, and a third mask section with cross-hatched sub-resolution aperture patterns adjacent has an area adjacent a trailing mask edge, with respect to the first direction. The first mask section is located between the second and third mask sections. In this manner, the mask can be used in a serpentine process. That is, the mask has a smoothing trailing edge regardless of the which direction the mask is moved. The section with cross-hatched sub-resolution aperture patterns transmits approximately 40% to 70%, and preferably 50% to 60% of incident light energy density.

The cross-hatched sub-resolution aperture patterns can be defined by vertical gaps and slits, as well as horizontal gaps and slits. In some aspects, the section with cross-hatched sub-resolution aperture patterns includes a plurality of different cross-hatched aperture patterns. For example, the section with cross-hatched sub-resolution aperture patterns can includes a first cross-hatched aperture pattern having a first set of vertical gaps and slits and a second cross-hatched aperture pattern having a second set of vertical gaps and slits.

Additional details of the above-described mask, a surface smoothing laser annealing mask system using a plurality of masks, and a method for smoothing an annealed surface using a cross-hatched sub-resolution mask pattern are described below.

BRIEF DESCRIPTION OF THE DRAWINGS

FIGS. 6a through 6d are more detailed depictions of the mask cross-hatched aperture patterns of FIG. 1.

FIG. 7 is a plan view of the present invention surface smoothing laser annealing mask system.

FIG. 8 is a flowchart illustrating the present invention method for smoothing an annealed surface using a cross-hatched sub-resolution mask pattern.

DETAILED DESCRIPTION OF THE PREFERRED EMBODIMENTS

Figure 5:
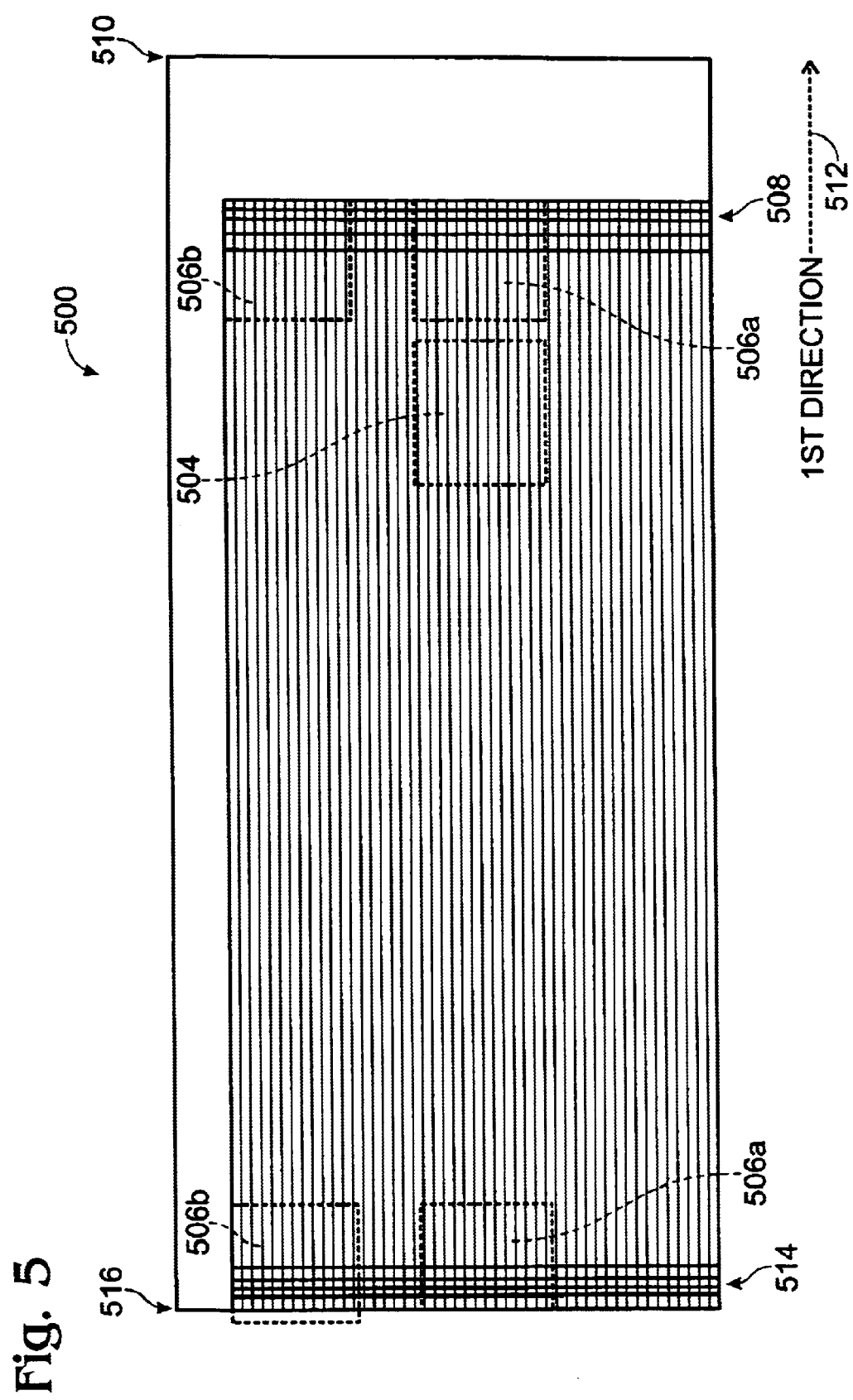
FIG. 5 is a plan view of the present invention laser annealing mask with cross-hatched sub-resolution aperture patterns.

FIG. 5 is a plan view of the present invention laser annealing mask with cross-hatched sub-resolution aperture patterns. The mask 500 comprises a first section 502 with aperture patterns 504 (an example area is shown in the dotted line box) for transmitting approximately 100% of incident light. The mask 500 also includes at least one section with cross-hatched sub-resolution aperture patterns 506a and/or 506b (as shown in the dotted line boxes) for diffracting incident light. As described below, the mask 500 can include a plurality of sections with cross-hatched sub-resolution aperture patterns.

Shown is a second mask section 508 with cross-hatched sub-resolution aperture patterns 506a in an area adjacent a leading mask vertical edge 510 with respect to a first direction 512. That is, edge 510 is the leading edge when the mask 500 is moved in the first direction 512. A third mask section 514 with cross-hatched sub-resolution aperture patterns 506 is an area adjacent a trailing mask vertical edge 516 with respect to the first direction 512. The first mask section 502 is located between the second and third mask sections 508/514.

The section with cross-hatched sub-resolution aperture patterns 506 transmits approximately 40% to 70% of incident light energy density. Typically, it is preferable that the section with cross-hatched sub-resolution aperture patterns 506 transmits approximately 50% to 60% of incident light energy density. The first mask section 502 has apertures with a first dimension. The section(s) with cross-hatched sub-resolution aperture patterns has a second dimension, less than the first dimension. As described below, one critical dimension is the slit width.

Figure 1:
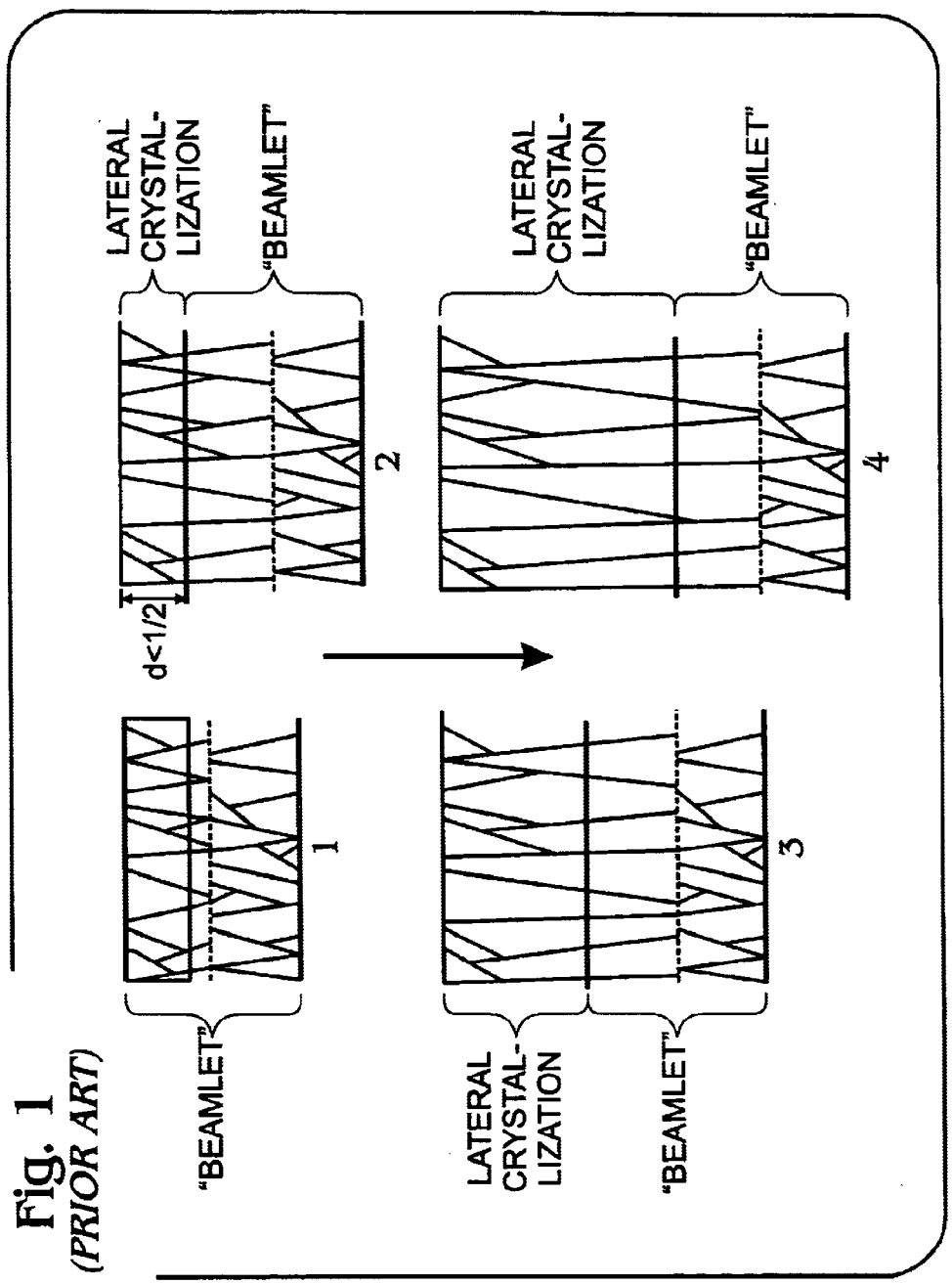
FIG. 1 is a diagram illustrating the LILaC process (prior art).
Figure 2:
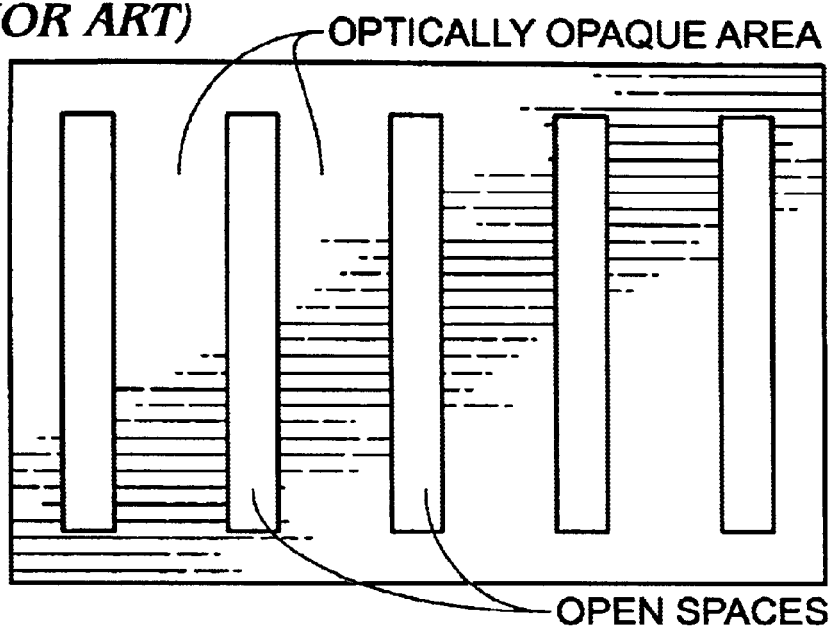
FIG. 2 is a conventional laser annealing mask (prior art).
Figure 4:
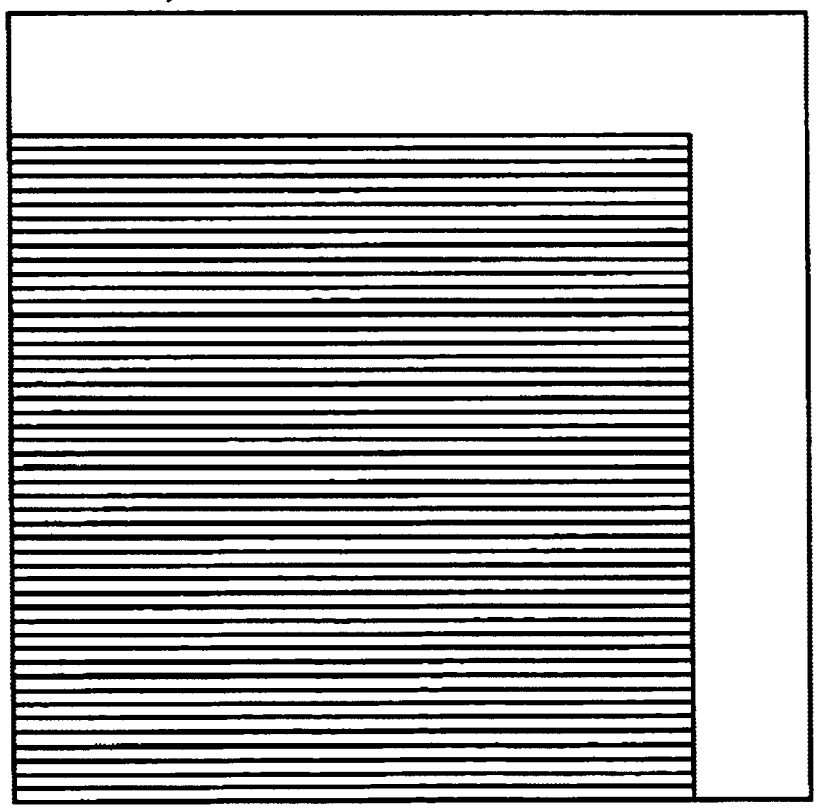
FIG. 4 is a plan view of a mask for partially melting a thin film (prior art).
Figure 3:
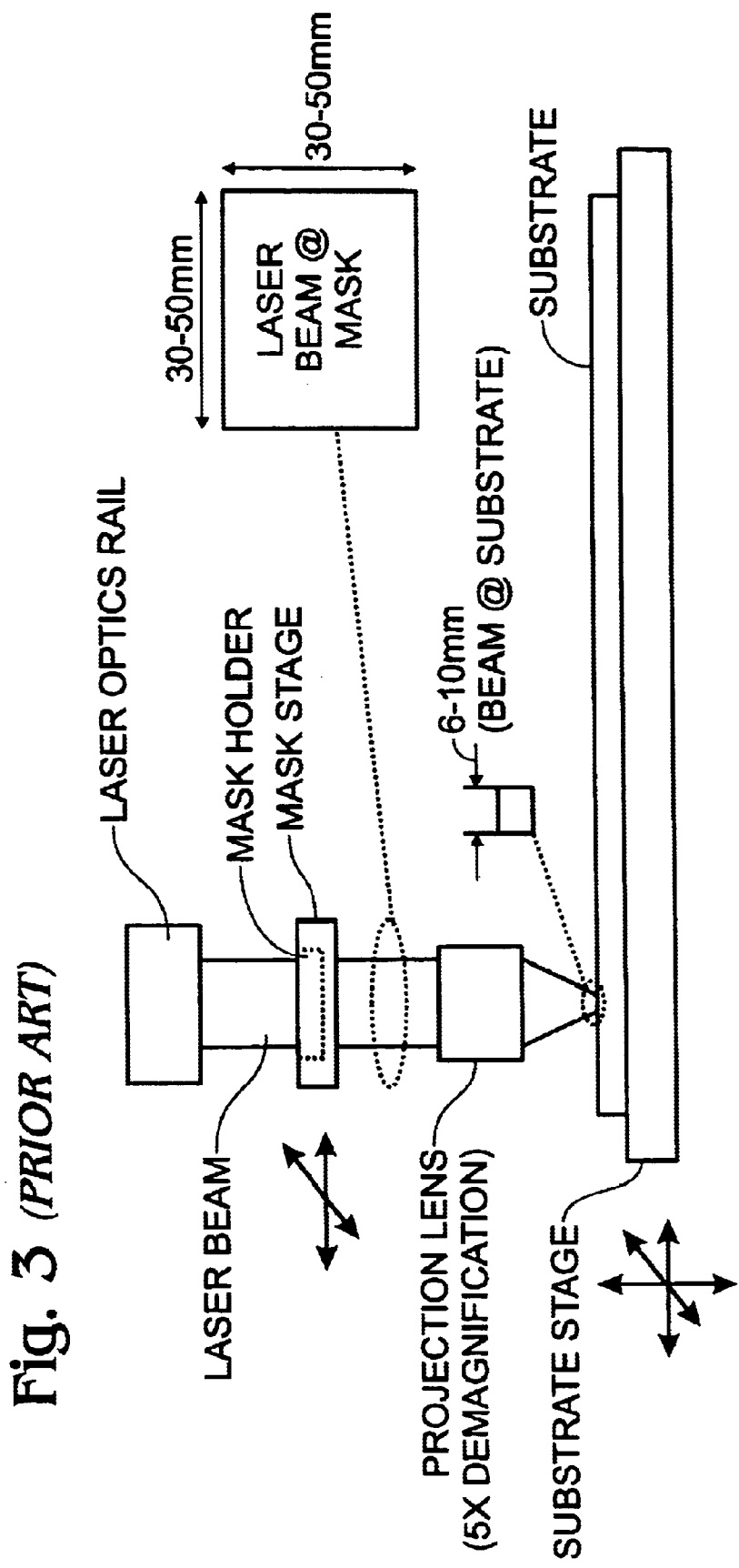
FIG. 3 is a pictorial representation of a system to accomplish the optical projection and the step-and repeat process (prior art).

FIGS. 6a through 6d are more detailed depictions of the mask cross-hatched aperture patterns 506a and 506b of FIG. 1. Although the second mask section 508 is particularly described in these figures, the following description is equally applicable to the third mask section (not shown in this figure).

Figure 6A:
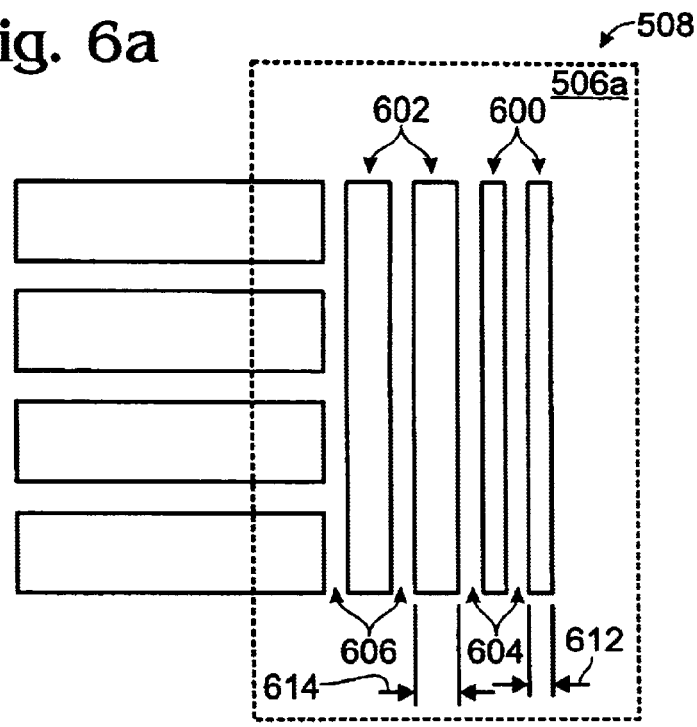

FIG. 6a depicts cross-hatched aperture pattern 506a on the mask vertical edge. More specifically, the section with cross-hatched sub-resolution aperture patterns (also called a cross-hatched aperture pattern or a diffraction section) of the second section 508 includes vertical gaps, such as gaps 604 and 606, and vertical slits, such as slits 606 and 602. Further, in some aspects (see FIG. 6b) the diffraction section includes horizontal gaps and horizontal slits. Note that the designation of vertical and horizontal is arbitrary and made only for the purpose of explaining the invention. As a general rule, especially if only vertical aperture pattern is being used, the ratio of vertical slits to vertical gaps is approximately 3:1.

Thus, the section with cross-hatched sub-resolution aperture patterns can include a plurality of different cross-hatched aperture patterns. In some aspects, the section with cross-hatched sub-resolution aperture patterns includes a first cross-hatched aperture pattern having a first set of vertical gaps 604 and vertical slits 600 and a second cross-hatched aperture pattern having a second set of vertical gaps 606 and vertical slits 602. In this example, the first vertical slit width 612 is approximately 0.00015 millimeters (mm) and the second vertical slit width 614 is approximately 0.00030 mm. The first vertical gap has a width 616 that is approximately 0.00015 mm and a second vertical gap width 628 that is approximately 0.00015 mm. However, the invention is not necessarily limited to these dimensions. Note that not all the vertical slits 600 and 602 need have the same dimensions.

Figure 6B:
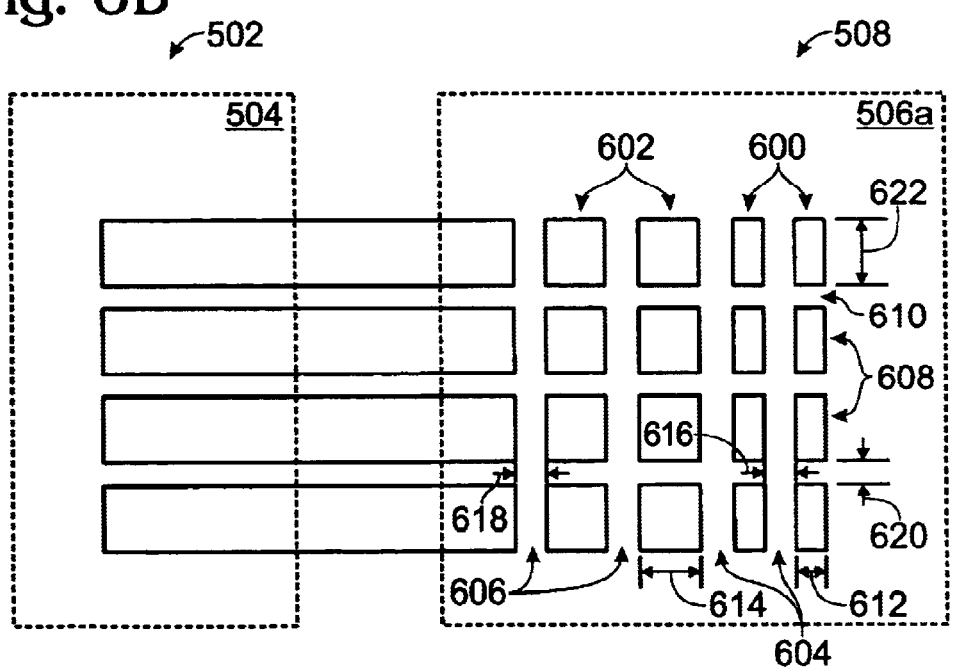

FIG. 6b depicts an alternate aspect of the cross-hatched aperture pattern 506a on the mask vertical edge. In some aspects, the diffraction section includes a fifth cross-hatched aperture pattern having a fifth set of horizontal gaps 610 and horizontal slits 608. As a general rule, if only one horizontal aperture pattern is being used, the ratio of slit widths to gap widths is approximately 3:1. The fifth horizontal gap 610 has a width 620 that is approximately 0.00015 mm and the fifth horizontal slit width 622 is approximately 0.00045 mm. Also note that not all the horizontal slits 608 need have the same dimensions.

It should be noted that the first mask section aperture pattern 504 includes a plurality of horizontal gaps and slits. These gaps and slits are the same as the fifth horizontal gaps and slits defined above. Alternately stated, the mask first section includes a plurality of slits 608 with a width 622 of approximately 0.00045 mm and a plurality of gaps 610 with a width 620 of approximately 0.00015 mm.

Figure 6C:
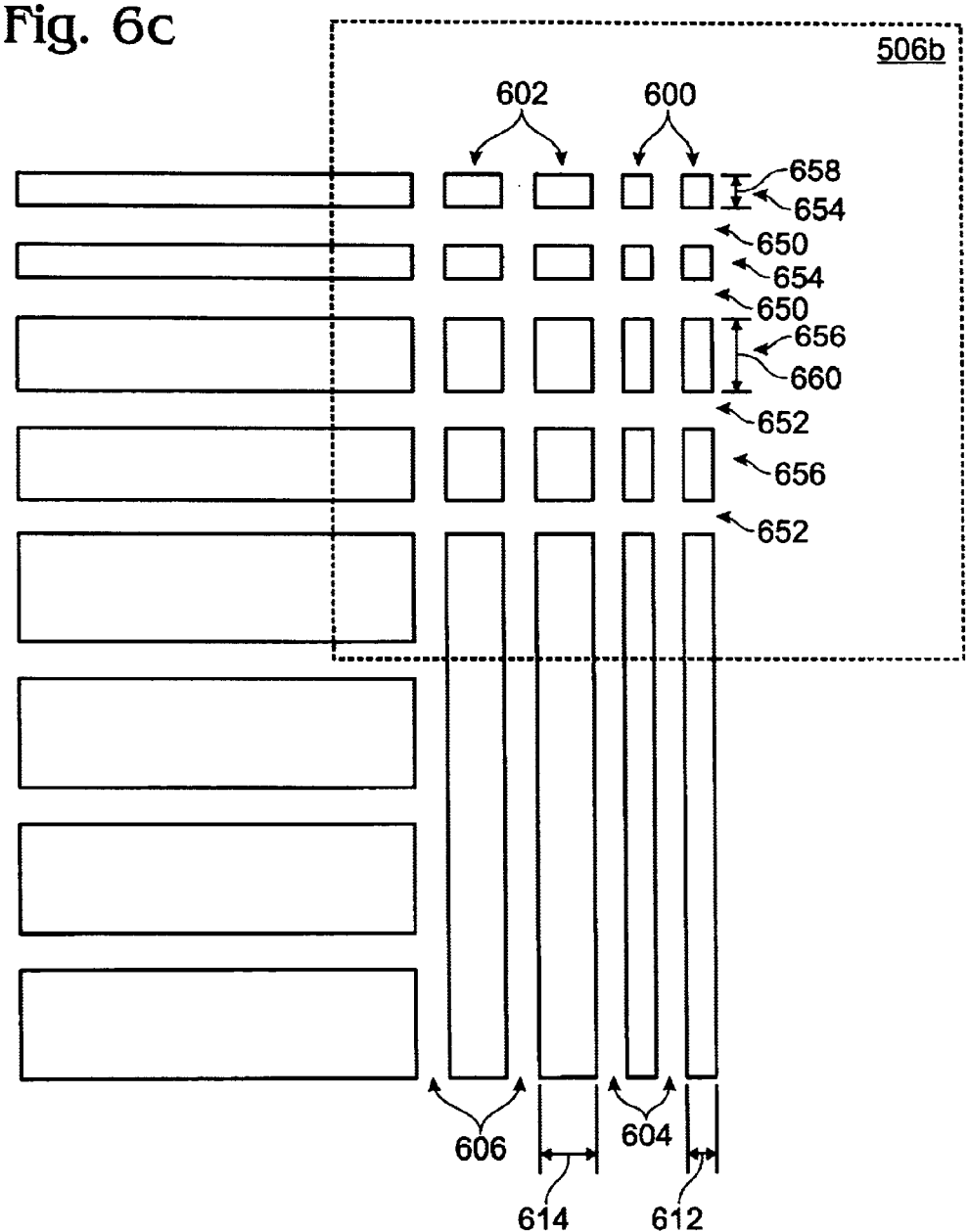

FIG. 6c depicts the cross-hatched aperture pattern 506b on the mask corner. It should be understood that although only the "upper" corner is particularly described, an equivalent description applies to a lower corner (not shown). Likewise, the explanations apply to corners in the mask third section, which are also not shown in the interest of brevity.

As above, the section with cross-hatched sub-resolution aperture patterns of the second section 508 includes vertical gaps, such as gaps 604 and 606, and vertical slits, such as slits 606 and 602. Further, the diffraction section includes horizontal gaps, such as gaps 610, 650, and 652 and horizontal slits, such as slits 608, 654, and 656.

Thus, the section with cross-hatched sub-resolution aperture patterns can include a plurality of different cross-hatched aperture patterns. In some aspects, the section with cross-hatched sub-resolution aperture patterns includes a first cross-hatched aperture pattern having a first set of vertical gaps 604 and vertical slits 600 and a second cross-hatched aperture pattern having a second set of vertical gaps 606 and vertical slits 602. Also note that not all the horizontal slits 608 need have the same dimensions. Likewise, not all the vertical slits 600 and 602 need have the same dimensions. In this example, the first vertical slit width 612 is approximately 0.00015 millimeters (mm) and the second vertical slit width 614 is approximately 0.00030 mm. The first vertical gap has a width 616 that is approximately 0.00015 mm and a second vertical gap width 628 that is approximately 0.00015 mm. However, the invention is not necessarily limited to these dimensions.

In some aspects, the section with cross-hatched sub-resolution aperture patterns includes a third cross-hatched aperture pattern having a third set of horizontal gaps 650 and horizontal slits 654 and a fourth cross-hatched aperture pattern having a fourth set of horizontal gaps 652 and horizontal slits 656. In this example, the third horizontal slit width 658 is approximately 0.00015 millimeters (mm) and the fourth horizontal slit width 660 is approximately 0.00030 mm. The third horizontal gap has a width 662 that is approximately 0.00015 mm and a fourth horizontal gap width 664 that is approximately 0.00015 mm. However, the invention is not necessarily limited to these dimensions.

FIG. 6d depicts another aspect of the cross-hatched aperture pattern 506b on the mask corner. In some aspects, the diffraction section includes a fifth cross-hatched aperture pattern having a fifth set of horizontal gaps 610 and horizontal slits 608. The fifth horizontal gap 610 has a width 620 that is approximately 0.00015 mm and the fifth horizontal slit width 622 is approximately 0.00045 mm.

As above, it should be noted that the first mask section includes a plurality of horizontal gaps and slits. These gaps and slits are the same as the fifth horizontal gaps and slits defined above. Alternately stated, the mask first section includes a plurality of slits 608 with a width 622 of approximately 0.00045 mm and a plurality of gaps 610 with a width 620 of approximately 0.00015 mm.

FIG. 7 is a plan view of the present invention surface smoothing laser annealing mask system. As mentioned above, the mask described in FIGS. 5, 6a, 6b, 6c, and 6d, permits a single mask to be used for a bi-directional (serpentine) annealing process. Alternately, two masks can be used. One mask for annealing in a first direction and a second mask for annealing in a second direction, opposite the first direction. The system 700 comprises a first mask 702 for annealing in a first direction 704. The first mask 702 includes a first section 706 with aperture patterns for transmitting approximately 100% of incident light and a section 708 with cross-hatched sub-resolution aperture patterns for diffracting incident light. The diffracting section 708 is located on the trailing edge 709 of the mask 702, respective to the first direction 704. The diffraction section 708a can be similar to cross-hatched aperture patterns 506a described above. Alternately, diffraction section 708b can be similar to patterns 506b described above, or a combination of patterns 506a and 506b. The detailed aspects of the diffraction section 708a/708b cross-hatched sub-resolution aperture patterns are the same as in the explanations of FIGS. 6a through 6d above, and will not be repeated in the interest of brevity.

A second mask 710 is used for annealing in a second direction 712 opposite the first direction. The second mask 710 includes a first section 714 with aperture patterns for transmitting approximately 100% of incident light and a section 716 with cross-hatched sub-resolution aperture patterns for diffracting incident light. The diffracting section 716 is located on the trailing edge 718 of the mask 710, respective to the second direction 712.

The diffraction section 716a can be similar to cross-hatched aperture patterns 506a described above. Alternately, diffraction section 716b can be similar to patterns 506b described above, or a combination of patterns 506a and 506b. The detailed aspects of the diffraction section 716 cross-hatched sub-resolution aperture patterns are the same as in the explanations of FIGS. 6a through 6d above, and will not be repeated in the interest of brevity.

Functional Description

In order to reduce the surface roughness, the present invention mask configuration is employed with a diffraction section that trails behind the crystallization (100% transmission) section to partially melt the surface of the silicon film. This partial melting permits mass redistribution, which leads to a drastic reduction in the peak-to-valley height. For example, the peak-to-valley height of a 1,000 Å thick film can be varied in response to the number of laser shots per area and/or the % transmission. Increasing numbers of shots per area, decreases the peak-to-valley height by up to 80%. However, for thinner films the use of 65% transmission for the calculated fluence at the sample can lead to complete melting of the film and destruction of the microstructure. This is not the case when the 55% transmission mask is used. Such a mask provides effective reduction of the peak-to-valley roughness within 3–5 shots per area.

Another important consideration is the effect of diffraction peaks at the edge of the beam being used for surface roughness reduction. Numerical simulations indicate that there is a considerable increase in the fluence at the edges. For the case of 0.45 micrometer ($\mu$m) slits and 0.15 $\mu$m gaps, the increase in fluence is approximately 10–20%.

However, features have been added to the present invention mask that alleviate the diffractive peak at the boundary of the irradiated region. This is done by "tapering" off the widths of the slits near the edges in order to reduce the amount of light that is transmitted. For the case of 0.45 $\mu$m slits and 0.15 $\mu$m gaps, two rows of 0.3 $\mu$m slits and two rows of 0.15 $\mu$m slits are used. In this case, the maximum intensity still occurs at the edge with the blocks, but is only ~3% greater than the overall intensity of the smoothing region (~56% transmission).

The present invention mask can be used to virtually eliminate diffraction effects, optimally reducing the large peak-to-valley roughness that is encountered following SLS/LILaC processing of thin Si films, while avoiding the potential for unwanted complete melting of the thin film during this post-processing step.

Optimal size slits and gaps in the mask induce a homogenous beam with ~56% of the processing fluence used for the SLS/LILaC process. This allows the surface roughness reducing mask to be incorporated into the overall mask design. In one pass, the Si thin film can be crystallized and have surface treatment carried out. Unwanted diffraction effects are eliminated at the edges of the homogenous beam used for surface treatment that conventionally lead to non-uniformities in the microstructure of the SLS/LILaC processed Si films by inducing localized complete melting. This is achieved by adjusting the widths of the slits at the edges of the mask pattern.

The use of the cross-hatched aperture patterns of FIGS. 6a and 6c provides comparable uniformity to the mask patterns of FIGS. 6b and 6d, respectively. The advantage of a mask using the patterns of FIGS. 6a and 6c is the ease of manufacture and a reduced likelihood of imperfections. In general, so long as the slit width to gap width ratio is approximately 3:1, the transmitted intensity of the homogenous beam will remain at ~56% of the SLS processing energy density.

FIG. 8 is a flowchart illustrating the present invention method for smoothing an annealed surface using a cross-hatched sub-resolution mask pattern. Although this method is depicted as a sequence of numbered steps for clarity, no order should be inferred from the numbering unless explicitly stated. It should be understood that some of these steps may be skipped, performed in parallel, or performed without the requirement of maintaining a strict order of sequence. The methods start at Step 800. Step 802 applies a laser beam having a first energy density to a silicon film region. Step 804 melts a silicon film region. Step 806 crystallizes the silicon film region. Step 808 applies a laser beam to the silicon film region transmitted through a cross-hatched sub-resolution mask region. In response, Step 810 smoothes the silicon film region surface.

In some aspects of the method, melting a silicon film region in Step 804 includes melting the silicon film region in response to the laser beam first energy density. Then, applying a laser beam to the silicon film region transmitted through a cross-hatched sub-resolution mask region in Step 808 includes applying a laser beam having a second energy density, less than the first energy density, to the silicon film region.

In other aspects, applying the laser beam transmitted through a cross-hatched sub-resolution mask region in Step 808 includes the second energy density being in the range of 40% to 70% of the first energy density. Preferably, the second energy density is in the range of 50% to 60% of the first energy density.

Some aspects of the method include further steps. Step 801a projects a laser beam through a projection system having a first resolution limit. Step 801b supplies a mask with a first mask section having apertures with a first dimension greater than or equal to the first resolution limit, and a cross-hatched sub-resolution mask section with apertures having a second dimension, less than the first resolution limit. Then, applying a laser beam having a first energy density to a substrate region in Step 802 includes transmitting approximately 100% of the supplied laser beam through the first mask region and applying the laser beam transmitted through a cross-hatched sub-resolution mask region in Step 808 includes transmitting less than 100% of the supplied laser beam through the cross-hatched sub-resolution mask region.

In some aspects, supplying a mask section with a cross-hatched aperture patterns in Step 801b includes supplying aperture patterns with vertical gaps and slits. In other aspects, supplying a mask section with a cross-hatched aperture patterns in Step 801b includes supplying aperture patterns with horizontal gaps and slits. Generally, if only a single horizontal or vertical aperture pattern is used, supplying a mask section with a cross-hatched aperture patterns includes supplying aperture patterns with gap widths that are approximately one-third the slit widths.

In some aspects, supplying a mask with a cross-hatched sub-resolution mask section includes supplying a mask section with a plurality of cross-hatched aperture patterns. For example, a mask section with a first cross-hatched aperture pattern adjacent a mask vertical edge having a first set of vertical gaps and slits and a second cross-hatched aperture pattern adjacent the first cross-hatched aperture pattern having a second set of vertical gaps and slits. In other aspects, a mask section is supplied with a third cross-hatched aperture pattern adjacent a mask horizontal edge having a third set of horizontal gaps and slits and a fourth cross-hatched aperture pattern adjacent the third cross-hatched aperture pattern having a fourth set of horizontal gaps and slits. Typically, the third horizontal slit width is less than the fourth horizontal slit width and the first vertical slit width is less than the second vertical slit width.

In some aspects of the method, supplying a mask section with a plurality of cross-hatched aperture patterns includes supplying a mask section with a fifth cross-hatched aperture pattern having a fifth set of horizontal gaps and slits. Typically, the fourth horizontal slit width is less than the fifth horizontal slit width. In some aspects, the fifth aperture pattern is used with the third and fourth aperture patterns. Then, the fifth aperture pattern is located adjacent the fourth cross-hatched aperture pattern.

In some aspects, projecting a laser beam through a projection system having a first resolution limit in Step 801*a* includes projecting a laser beam through a projection system having a resolution limit of approximately 0.002 mm. Then, supplying a cross-hatched sub-resolution mask section in Step 801*b* includes the first vertical slit width being approximately 0.00015 mm and the second vertical slit width being approximately 0.00030 mm. Likewise, the third horizontal slit width is approximately 0.00015 mm and a fourth horizontal slit width is approximately 0.00030 mm.

Further, the first vertical gap width is approximately 0.00015 mm and the second vertical gap width is approximately 0.00015 mm. The third horizontal gap width is approximately 0.00015 mm and a fourth horizontal gap width is approximately 0.00015 mm. The fifth horizontal slit width is approximately 0.00045 mm and the fifth horizontal gap width is approximately 0.00015 mm.

In some aspects, supplying a cross-hatched sub-resolution mask section in Step 801*b* includes the first set (the number of first vertical gaps and slits) being equal to two. The second set (the number of second vertical gaps and slits) is equal to two. The third set (the number of third horizontal gaps and slits) is equal to two, and the fourth set (the number of fourth horizontal gaps and slits) is equal to two.

In some aspects, supplying a mask with a first mask section having apertures in Step 801*b* includes supplying a first mask section with a plurality of slit widths of approximately 0.00045 mm and a plurality of gap widths of approximately 0.00015 mm.

In some aspects of the method, applying a laser beam having a first energy density to a silicon film region in Step 804 includes applying the first energy density to a first area in the silicon film region. Then a further step, Step 812, step-and-repeats the application of the first energy density to a second area in the silicon film region adjacent the first area. Applying a laser beam to the silicon film region transmitted through a cross-hatched sub-resolution mask region in Step 808 includes applying the second energy density to the first area. A further step, Step 814, step-and-repeats the application of the second energy density to the second area.

In some aspects of the method, a further step, Step 801*c*, supplies a silicon film having a thickness in the range of 200 to 4000 Å. Then, smoothing the silicon film surface in Step 810 includes melting less than 100% of the silicon film thickness. For example, when a silicon film having a thickness of 1000 Å is supplied, Step 810 melts the silicon film surface to a thickness in the range of approximately 800 Å. In another example, if a silicon film having a thickness of 750 Å is supplied, Step 810 melts the silicon film surface to a thickness of approximately 550 Å. In yet another example, if a silicon film having a thickness of 500 Å is supplied, Step 810 melts the silicon film surface to a thickness of approximately 300 Å. As a general rule, if a silicon film having a thickness of (X) Å is supplied, Step 810 melts the silicon film surface to a thickness of approximately (X−200) Å to (X−100) Å.

A surface smoothing annealing mask, a surface smoothing laser annealing mask system using a plurality of masks, and a method for smoothing an annealed surface using a cross-hatched sub-resolution mask pattern have been described. A few examples have been provided that depict specific cross-hatched aperture patterns and the placement of aperture patterns on the mask. However, the present invention is not limited to merely these examples. Other variations and embodiments of the invention will occur to those skilled in the art.

We claim:

1. A laser annealing mask with cross-hatched sub-resolution aperture patterns, the mask comprising:
   a first section with aperture patterns for transmitting approximately 100% of incident light; and,
   at least one section with cross-hatched sub-resolution aperture patterns for diffracting incident light.

2. The mask of claim 1 further comprising:
   a second mask section with cross-hatched sub-resolution aperture patterns having an area adjacent a leading mask edge with respect to a first direction;
   a third mask section with cross-hatched sub-resolution aperture patterns adjacent having an area adjacent a trailing mask edge with respect to the first directions; and,
   wherein the first mask section is located between the second and third mask sections.

3. The mask of claim 1 wherein the section with cross-hatched sub-resolution aperture patterns transmits approximately 40% to 70% of incident light energy density.

4. The mask of claim 3 wherein the section with cross-hatched sub-resolution aperture patterns transmits approximately 50% to 60% of incident light energy density.

5. The mask of claim 1 wherein the first mask section has apertures with a first dimension; and,
   wherein the section with cross-hatched sub-resolution aperture patterns has a second dimension, less than the first dimension.

6. The mask of claim 1 wherein the section with cross-hatched sub-resolution aperture patterns includes vertical gaps and slits.

7. The mask of claim 6 wherein the section with cross-hatched sub-resolution aperture patterns includes horizontal gaps and slits.

8. The mask of claim 7 wherein the gap widths are approximately one-third the slit widths.

9. The mask of claim 7 wherein the section with cross-hatched sub-resolution aperture patterns includes a plurality of different cross-hatched aperture patterns.

10. The mask of claim 7 wherein the section with cross-hatched sub-resolution aperture patterns includes a first cross-hatched aperture pattern adjacent a mask vertical edge having a first set of vertical gaps and slits and a second cross-hatched aperture pattern adjacent the first cross-hatched aperture pattern having a second set of vertical gaps and slits.

11. The mask of claim 10 wherein the section with cross-hatched sub-resolution aperture patterns includes a third cross-hatched aperture pattern adjacent a mask horizontal edge having a third set of horizontal gaps and slits and a fourth cross-hatched aperture pattern adjacent the third cross-hatched aperture pattern having a fourth set of horizontal gaps and slits.

12. The mask of claim 11 wherein the third horizontal slit width is less than the fourth horizontal slit width.

13. The mask of claim 11 wherein the section with cross-hatched sub-resolution aperture patterns includes a fifth cross-hatched aperture pattern adjacent the fourth cross-hatched aperture pattern having a fifth set of horizontal gaps and slits.

14. The mask of claim 13 wherein the fourth horizontal slit width is less than the fifth horizontal slit width.

15. The mask of claim 11 wherein the section with cross-hatched sub-resolution aperture patterns includes the third horizontal slit width being approximately 0.00015 mm and the fourth horizontal slit width being approximately 0.00030 mm.

16. The mask of claim 11 wherein the section with cross-hatched sub-resolution aperture patterns includes the third horizontal gap being approximately 0.00015 mm and the fourth horizontal gap being approximately 0.00015 mm.

17. The mask of claim 11 wherein the section with cross-hatched sub-resolution aperture patterns includes the first set of slits being equal to two, the second set of slits being equal to two, the third set of slits being equal to two, and the fourth set of slits being equal to two.

18. The mask of claim 10 wherein the first vertical slit width is less than the second vertical slit width.

19. The mask of claim 10 wherein the section with cross-hatched sub-resolution aperture patterns includes a fifth cross-hatched aperture pattern having a fifth set of horizontal gaps and slits.

20. The mask of claim 19 wherein the section with cross-hatched sub-resolution aperture patterns includes the fifth horizontal slit width being approximately 0.00045 mm.

21. The mask of claim 20 wherein the section with cross-hatched sub-resolution aperture patterns includes the fifth horizontal gap width being approximately 0.00015 mm.

22. The mask of claim 10 wherein the section with cross-hatched sub-resolution aperture patterns includes the first vertical slit width being approximately 0.00015 millimeters (mm) and the second vertical slit width being approximately 0.00030 mm.

23. The mask of claim 10 wherein the section with cross-hatched sub-resolution aperture patterns includes the first vertical gap being approximately 0.00015 mm and the second vertical gap being approximately 0.00015 mm.

24. The mask of claim 1 wherein the first mask section includes a plurality of slits with a width of approximately 0.00045 mm and a plurality of gaps with a width of approximately 0.00015 mm.

25. The mask of claim 1 further comprising:
a plurality of sections with cross-hatched sub-resolution aperture patterns.

26. A surface smoothing laser annealing mask system comprising:
a first mask for annealing in a first direction, the first mask including:
a first section with aperture patterns for transmitting approximately 100% of incident light; and,
a section with cross-hatched sub-resolution aperture patterns for diffracting incident light located on the trailing edge of the mask, respective to the first direction; and,
a second mask for annealing in a second direction opposite the first direction, the second mask including:
a first section with aperture patterns for transmitting approximately 100% of incident light; and,
a section with cross-hatched sub-resolution aperture patterns for diffracting incident light located on the trailing edge of the mask, respective to the second direction.

27. The system of claim 26 wherein the first and second mask sections with cross-hatched sub-resolution aperture patterns each include horizontal gaps and slits, as well as vertical gaps and slits.

28. The system of claim 27 wherein the first and second mask sections with cross-hatched sub-resolution aperture patterns each include a plurality of different cross-hatched aperture patterns.

29. The system of claim 28 wherein the first and second mask sections with cross-hatched sub-resolution aperture patterns a first cross-hatched aperture pattern adjacent a mask vertical edge having a first set of vertical gaps and slits and a second cross-hatched aperture pattern adjacent the first cross-hatched aperture pattern having a second set of vertical gaps and slits.

30. The system of claim 29 wherein the first vertical slit width is less than the second vertical slit width.

31. The system of claim 29 wherein the first and second mask sections with cross-hatched sub-resolution aperture patterns each include a fifth cross-hatched aperture pattern having a fifth set of horizontal gaps and slits.

32. The system of claim 29 wherein the first and second mask sections with cross-hatched sub-resolution aperture patterns include a third cross-hatched aperture pattern adjacent a mask horizontal edge having a third set of horizontal gaps and slits and a fourth cross-hatched aperture pattern adjacent the third cross-hatch aperture pattern having a fourth set of horizontal gaps and slits.

33. The system of claim 32 wherein the third horizontal slit width is less than the fourth horizontal slit width.

34. The system of claim 32 wherein the first and second mask sections with cross-hatched sub-resolution aperture patterns each include a fifth cross-hatched aperture pattern adjacent the fourth aperture pattern having a fifth set of horizontal gaps and slits.

35. The system of claim 34 wherein the fourth horizontal slit width is less than the fifth horizontal slit width.

* * * * *